United States Patent [19]
Aksyuk et al.

[11] Patent Number: 5,912,094
[45] Date of Patent: Jun. 15, 1999

[54] METHOD AND APPARATUS FOR MAKING A MICRO DEVICE

[75] Inventors: Vladimir A. Aksyuk, Piscataway; David J. Bishop, Summit; Peter L. Gammel, Millburn, all of N.J.

[73] Assignee: Lucent Technologies, Inc., Murray Hill, N.J.

[21] Appl. No.: 08/856,565

[22] Filed: May 15, 1997

[51] Int. Cl.[6] ....................................... G03F 9/00
[52] U.S. Cl. .................................. 430/5; 430/22
[58] Field of Search ........................... 430/22, 5; 355/53, 355/75

[56] References Cited

U.S. PATENT DOCUMENTS 5,726,480  3/1998  Pfister ...................................... 257/415

OTHER PUBLICATIONS

Pister et al., "Microfabricated Hinges," v. 33, Sensors and Actuators A, pp. 249–256, 1992.

*Primary Examiner*—S. Rosasco

[57] ABSTRACT

A hinged mask and a method for its use in manufacturing MEMS device are disclosed. According to the invention, the hinged mask and a portion of the MEMS device are formed at the same time on a support. Openings are formed in the mask, the openings defining a pattern that is transferable in the form of a patterned layer. After release of the MEMS device, the hinged mask is rotated out-of-plane about 180° to lie on top of the MEMS device. The hinged mask is used as a micro-sized shadow mask to deposit a patterned film of arbitrary composition on the MEMS device. Since the hinged plate is formed by the original lithography, it is aligned to the MEMS device with a high degree of accuracy.

10 Claims, 8 Drawing Sheets

METHOD AND APPARATUS FOR MAKING A MICRO DEVICE

FIELD OF THE INVENTION

The present invention relates generally to a method and apparatus for making micromechanical or microelectromechanical devices.

BACKGROUND OF THE INVENTION

Microelectromechanical systems (MEMS) devices are typically fabricated by depositing a plurality of materials layers, some of which are then removed by selective etching during a release procedure. For complex structures, MEMS device manufacture often requires depositing additional patterned films or layers upon a portion of the MEMS device after the initially deposited layers have been released. Such post processing is occasioned due to the limitations imposed on the selection of film materials by the etchant, typically acid, used in the release.

Using conventional photolithographic techniques during such post processing often provides unsatisfactory results. Covering the partially-formed MEMS device with photoresist can damage it. As a result, the ability to add structure to the MEMS device during post-processing is limited. Alternatively, conventional shadow masks can be used to deposit a patterned layer, however, alignment of such masks can be problematic.

As such, there is a need for a MEMS fabrication method that does not limit film composition or MEMS device configuration and avoids alignment problems.

SUMMARY OF THE INVENTION

According to the present method, a hinged mask that is rotatable 180° about the hinge is used as a micro-sized shadow mask to deposit a patterned film of arbitrary composition on a released MEMS device. The hinged mask is formed coincidently with the pre-released MEMS device. Suitably placed openings or bores are formed in the mask. The openings define a pattern that is transferable in the form of a patterned layer that is deposited on the released MEMS device. Since the hinged plate is formed by the original lithography, i.e., simultaneously with the films forming the pre-released MEMS device, it can be aligned to the MEMS device with a high degree of accuracy.

After release, the hinged mask is rotated about the hinge and placed over the MEMS device. Using the hinged mask as a shadow mask, a patterned layer is directly deposited on the MEMS device. The mask is then rotated away from the MEMS device, allowing, as the application dictates, one or more additional masks to be sequentially rotated into position above the MEMS device and additional patterned layers to be deposited.

In this manner, an arbitrarily complicated structure can be formed on a released MEMS device.

BRIEF DESCRIPTION OF THE DRAWINGS

Further features of the invention will become more apparent from the following detailed description of specific embodiments thereof when read in conjunction with the accompanying drawings, in which.

DETAILED DESCRIPTION

Figure 1:
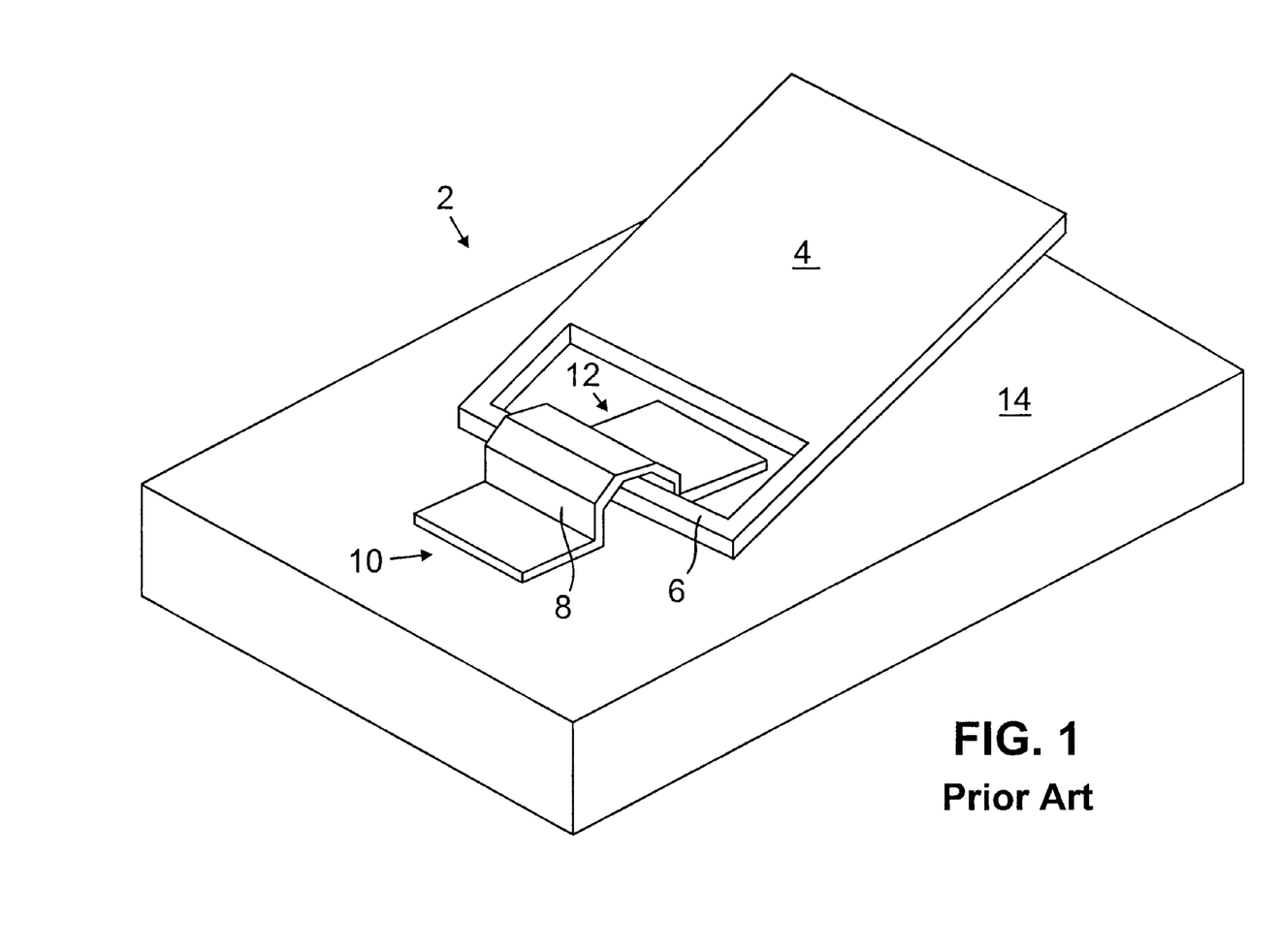
FIG. 1 shows an exemplary embodiment of a micro-hinge suitable for forming a hinged mask according to the present invention.

FIG. 1 is a perspective view of an exemplary embodiment of a micro-hinge 2 suitable for use in conjunction with the present invention. The micro-hinge 2 includes a plate 4, a hinge pin 6 and a staple 8. The micro-hinge 2 is hinged to a substrate 14. The staple 8 is attached to the substrate 14 at contact points 10 and 12. The staple 8 and hinge pin 6 are suitably fabricated so that the plate 4 is substantially free to rotate up to and including 180° off the substrate 14. The micro-hinge 2 can be formed via a three-mask double-layer polysilicon process with oxide sacrificial layers using low-pressure chemical vapor deposition (LPCVD). See, Pister et al., "Microfabricated Hinges," v. 33, Sensors and Actuators A, pp. 249–256, 1992, incorporated by reference herein.

Figure 2:
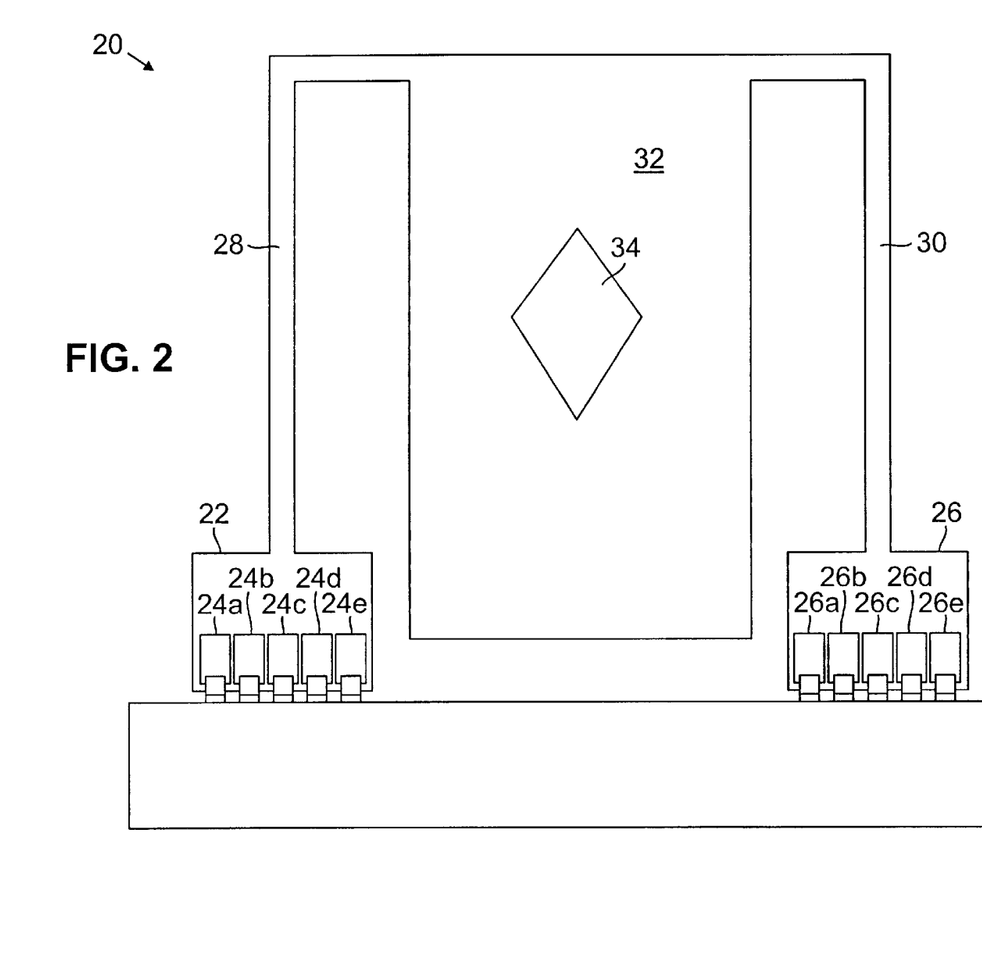
FIG. 2 shows an exemplary embodiment of a hinged mask according to the present invention.

FIG. 2 shows an exemplary embodiment of a hinged mask 20 according to the present invention. As shown in FIG. 2, the exemplary hinged mask 20 includes two compound hinges 22, 26, a mask 32 and opening 34. Arms 28 and 30 connect respective compound hinges 22 and 26 to the mask 32.

The compound hinges 22, 26 consist of respective pluralities of micro-hinges 24a–e and 26a–e. The structure of micro-hinges 24a–e and 26a–e are adapted from the micro-hinge 2 illustrated in FIG. 1. A plurality of such micro-hinges are used in preference to a single micro-hinge to improve robustness. Other configurations of compound hinges for such "heavy-duty"service, based on the simple exemplary micro-hinge 2 shown in FIG. 2, may suitably be used. Moreover, it should be appreciated that in other embodiments, the compound hinges 22 and 26 may be directly attached to the mask 32 so that arms 28 and 30 are not required.

The opening 34 is suitably configured for transferring a desired pattern to the surface of a released MEMS device. It will be appreciated that more than one opening 34 can be included in the mask as appropriate to pattern a layer into a particular configuration.

The compound hinges 22, 26, arms 28, 30 and mask 32 can be formed of polysilicon, silicon nitride, silicon oxide and other materials typically used for MEMS device manufacture.

The exemplary hinged mask 20 of FIG. 2 can be used in a method according to the present invention for fabricating a MEMS device. An exemplary method for such purpose is illustrated by flow-diagram in FIG. 3.

Figure 3:
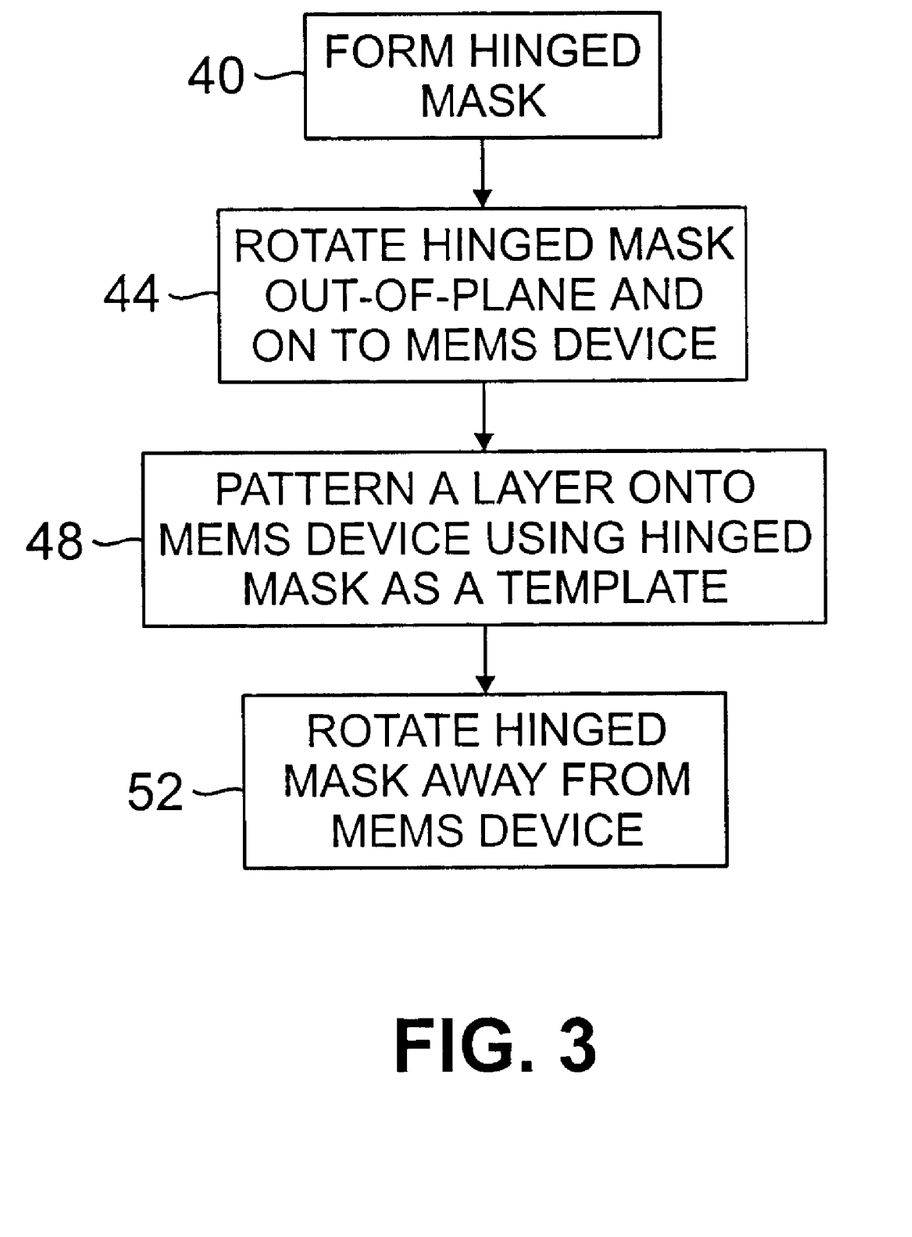
FIG. 3 is a flow diagram of method for forming a MEMS device using the hinged mask of FIG. 2.

As indicated in operation block 40, one or more hinged masks, such as the mask 20, are formed during photolithographic patterning of a MEMS device. Formation of the hinged masks during MEMS patterning advantageously provides for precision alignment of the hinged masks to the MEMS device.

After the MEMS device and the hinged masks are released, a hinged mask is rotated out of the plane of the substrate or wafer through approximately 180° (i.e., nearly back in the plane) to lay on top of the released MEMS device, as noted in operation block 44. Electrostatic, magnetic or mechanical instrumentalities can be used to rotate the hinged mask into position. Optional locking members suitable for locking the hinged masks in position can be provided. In one embodiment, such a locking member is configured as a flexible beam, attached to the substrate at one end. The locking member is positioned on the substrate so that a portion of the free end of the locking member can be positioned on top of a hinged mask that has been rotated in position. The flexion in the beam as a result of positioning it on top of the hinged mask provides a biasing force that substantially prevents the hinged mask from moving.

A dry pattern transfer of the pattern defined by the mask is performed, as indicated in block 48. It will be readily apparent to those skilled in the art that the hinged mask is functioning as a shadow mask. Dry pattern transfer via shadow mask is old in the art. Since wet etching is avoided, a wide variety of materials may be deposited on the MEMS device.

As indicated in block 52, the hinged mask is rotated away from the MEMS device and preferably back to its original position in the plane of the substrate after pattern transfer. If additional hinged masks are present for pattern transfer, they are sequentially rotated into place for patterning.

It will be appreciated that the present method advantageously provides the ability to place a virtually unlimited variety of structures capable of a wide range of functions on a released MEMS device. Several nonlimiting examples of such structures include, dielectric mirrors, dielectric filters, polarizers, devices having a nonlinear optical response such as frequency doublers, and the like.

FIGS. 4–8 show an exemplary arrangement comprising two hinged masks and a released MEMS device, and illustrate the use of such masks according to the aforedescribed method for depositing additional structure onto the MEMS device.

Figure 4:
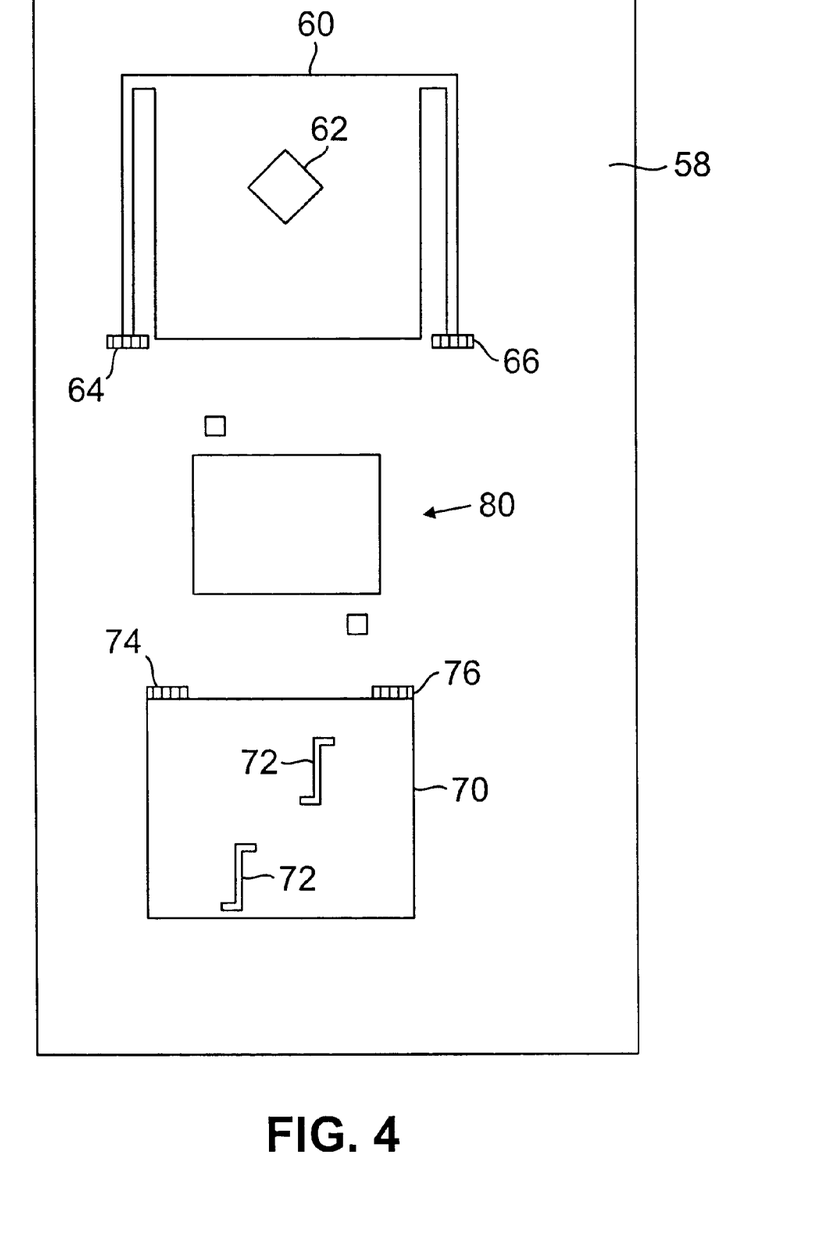
FIG. 4 shows two exemplary hinged masks and a released MEMS device.
Figure 5:
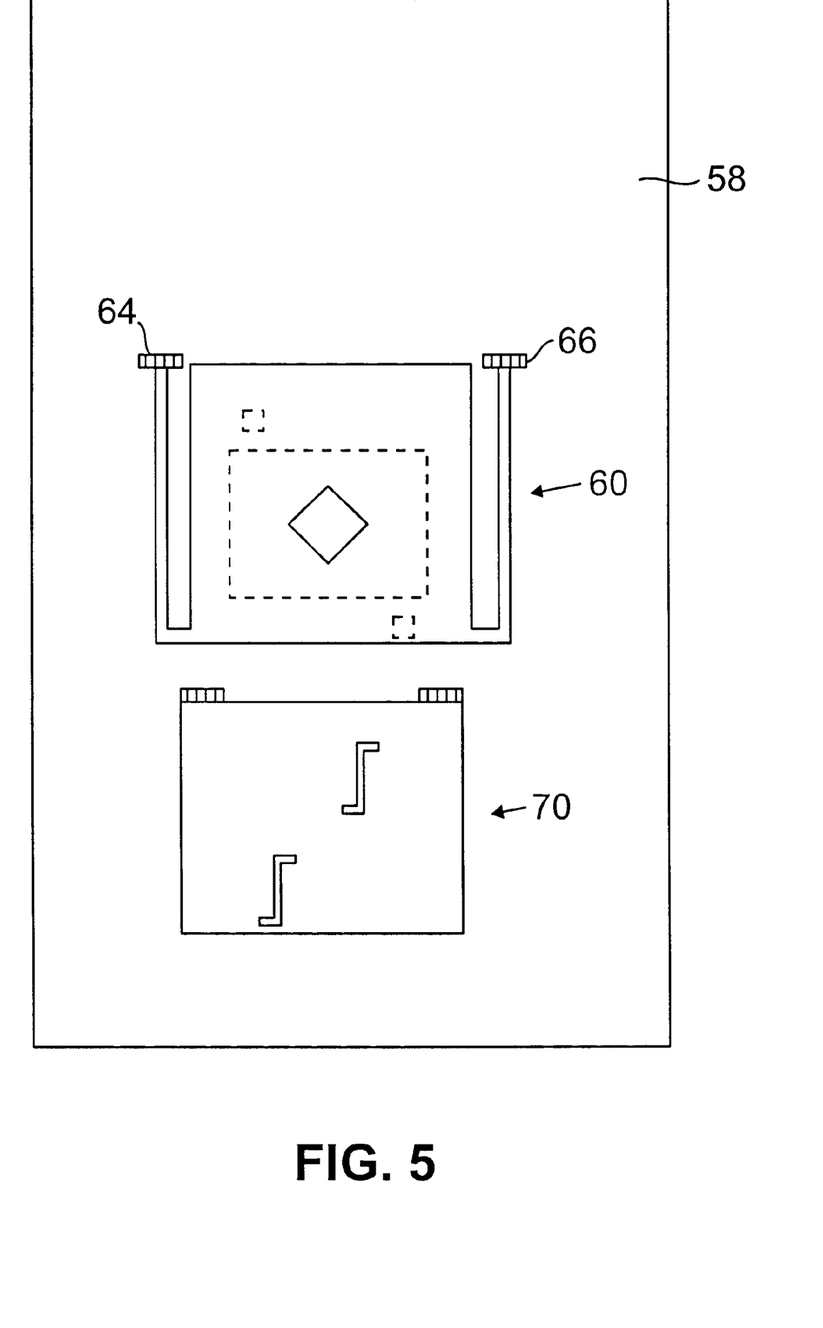
FIG. 5 shows one of the hinged masks of FIG. 4 rotated over the MEMS device.

FIG. 4 shows a first hinged mask 60 with opening 62, a second hinged mask 70 with openings 72 and a released MEMS device 80. The first and second hinged masks 60, 70 are rotatably attached to a substrate 58 at respective compound hinges 64, 66 and 74, 76. In preparation for disposing a patterned layer 82 on the MEMS device 80, the first hinged mask 60 is rotated out of the plane of the substrate 58 towards the MEMS device 80. FIG. 5 shows the first hinged mask 60 lying directly over the MEMS device.

Figure 6:
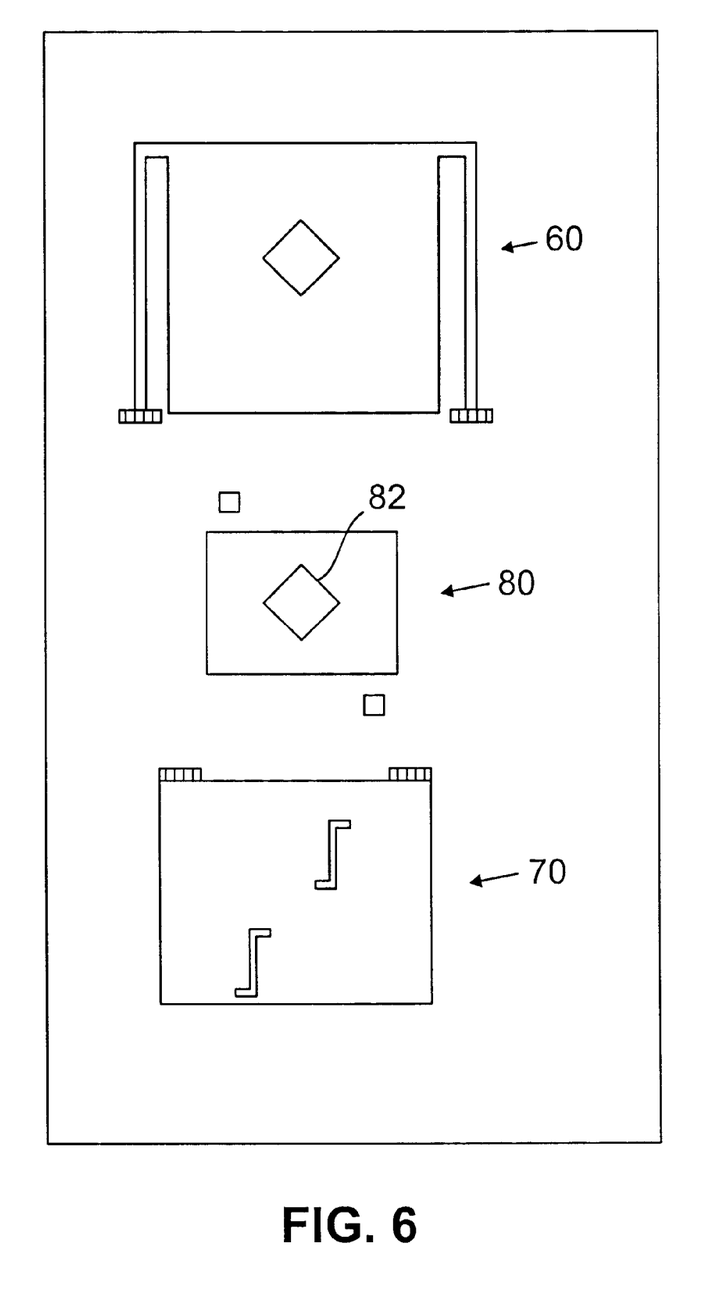
FIG. 6 shows a layer patterned on the MEMS device using the rotated hinged mask of FIG. 5.

Using the first hinged mask 60 as a shadow mask, a patterned layer 82 is then deposited on the MEMS device 80. FIG. 6 shows the MEMS device 80 after dry pattern transfer of the patterned layer 82 and after the first hinged mask 60 has been rotated away from the MEMS device and back in to the plane of the substrate 58.

Figure 7:
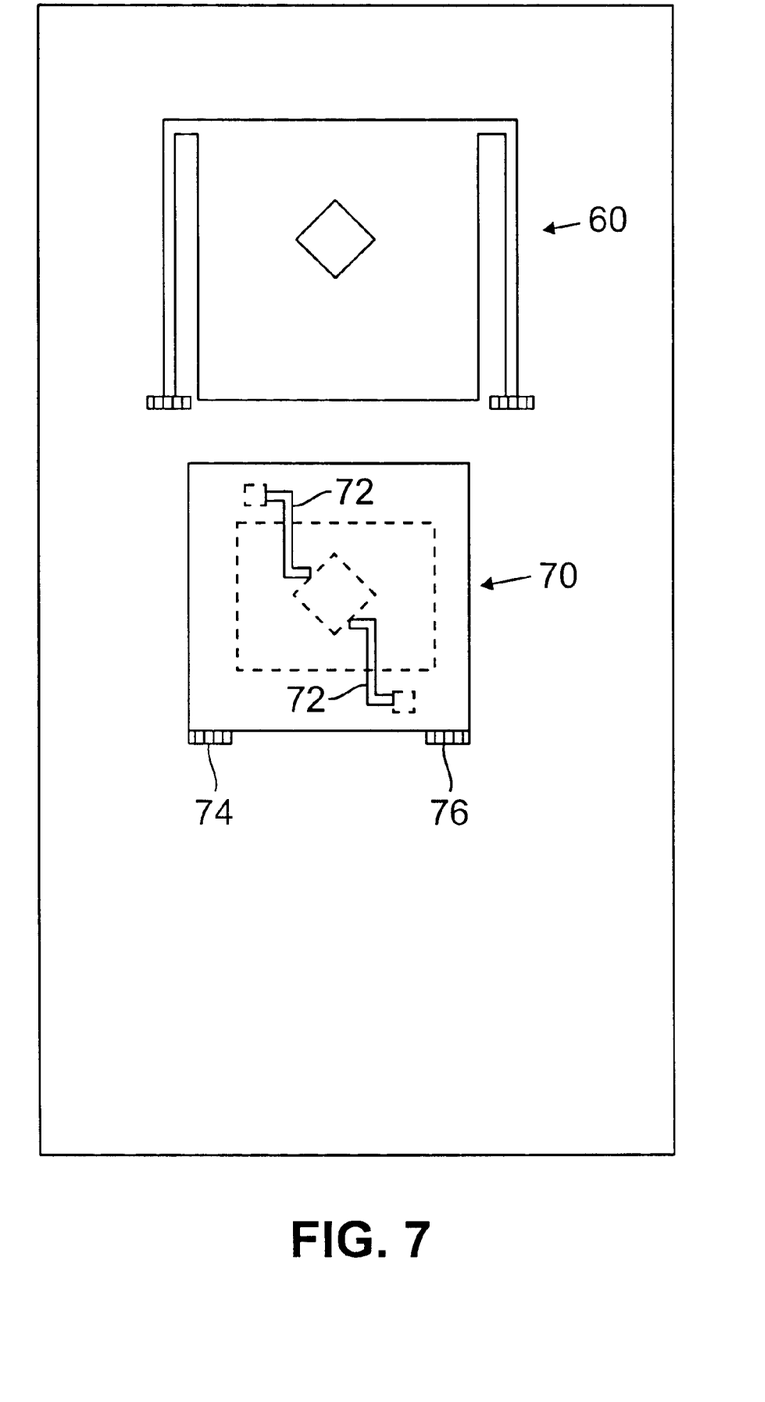
FIG. 7 shows a second one of the hinged masks of FIG. 4 rotated over the MEMS device.

To dispose a second patterned layer 84 having a structure defined by the openings 72, the second hinged mask 70 is rotated into position directly over the MEMS device 80. FIG. 7 shows the second hinged mask 70 lying directly over the MEMS device.

Figure 8:
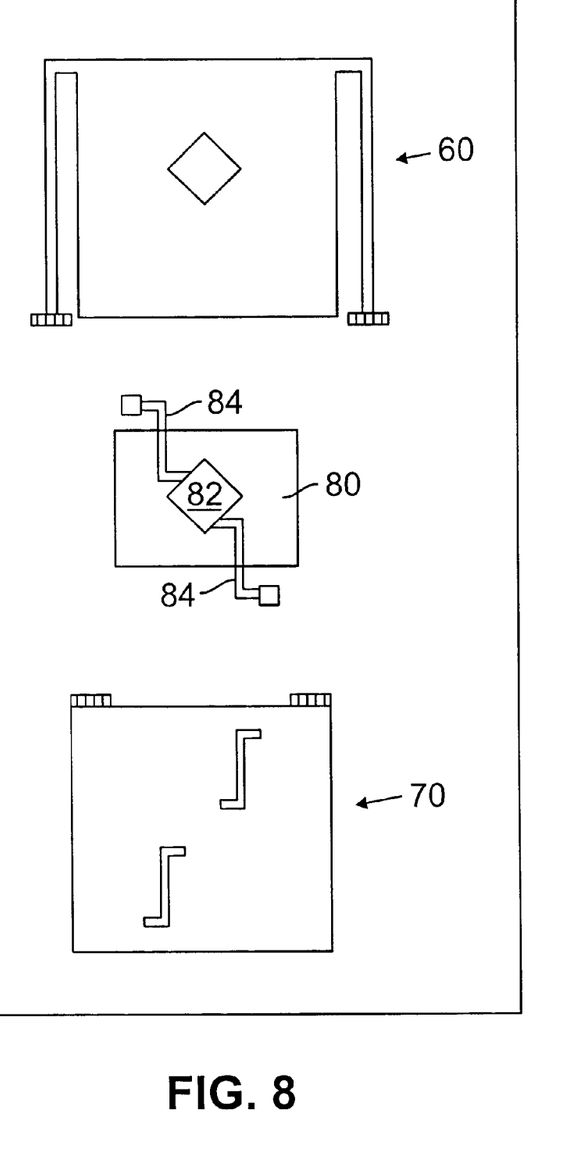
FIG. 8 shows structure patterned on the MEMS device of FIG. 6 via the second rotated hinged mask of FIG. 7.

FIG. 8 shows the MEMS device 80 after the second dry pattern transfer by which patterned layer 84 is added to the MEMS device 80. The second hinged mask 70 is shown rotated away from the MEMS device and in the plane of the substrate 58 in FIG. 8.

Although specific embodiments of this invention have been shown and described herein, it is to be understood that these embodiments are merely illustrative of the many possible specific arrangements that can be devised in application of the principles of the invention. Numerous and varied other arrangements can be devised in accordance with these principles by those of ordinary skill in the art without departing from the scope and spirit of the invention.

We claim:

1. An article comprising a hinged mask, comprising:

a hinge connected to a support; and a mask having an opening defining a predetermined pattern for transfer to a surface, the mask rotatably connected to the hinge, wherein, a first layer having the predetermined pattern is formed on the surface when a first material is suitably delivered to the mask.

2. The article of claim 1 wherein the surface is a portion of a released microelectromechanical systems device.

3. The article of claim 2, and further comprising the released micro electro mechanical systems device.

4. The article of claim 1, and further wherein the mask is rotatable through 180° within the hinge.

5. The article of claim 1 and further wherein a second and further layers of the first or other materials are patterned on the surface, said first, second and further layers collectively forming structures selected from the group consisting of dielectric mirrors, dielectric filters, polarizers and device having a nonlinear optical response.

6. An article for making a microdevice, comprising:

a layer disposed on a support; and a first mask having a first opening defining a first pattern for transfer to a first region of the layer, the first mask being rotatably attached to the support such that, when rotated, the first opening aligns with the first region of the layer.

7. The article of claim 6, and further comprising:

a second mask having a second opening defining a second pattern for transfer to a second region of the layer, the second mask being rotatably attached to the support such that, when rotated, the second opening aligns with the second region of the layer.

8. The article of claim 7, and further comprising:

first and second sets of hinges by which the respective first and second masks are rotatably attached to the support.

9. The article of claim 8, wherein each hinge comprises:

a staple disposed on the support; and a hinge pin attached to a portion of the first or the second mask, wherein the hinge pin passes through a gap between the staple and the support, and wherein the hinge pin is free to rotate within the gap.

10. The article of claim 6, and further comprising:

a locking member operable to prevent the first mask from moving from its rotated position.

* * * * *